(12) United States Patent
Ochi et al.

(10) Patent No.: US 8,589,964 B2
(45) Date of Patent: Nov. 19, 2013

(54) COOLING ARRANGEMENT FOR AN OPTICAL PICK-UP

(75) Inventors: Manabu Ochi, Fujisawa (JP); Yukinari Ueki, Fujisawa (JP); Yoshitaka Kusano, Yokohama (JP); Hiroyasu Yoshida, Yokohama (JP); Fumihito Ichikawa, Yokohama (JP)

(73) Assignee: Hitachi Media Electronics Co., Ltd., Iwate-Ken (JP)

( * ) Notice: Subject to any disclaimer, the term of this patent is extended or adjusted under 35 U.S.C. 154(b) by 1137 days.

(21) Appl. No.: 11/191,939

(22) Filed: Jul. 29, 2005

(65) Prior Publication Data

US 2006/0117332 A1 Jun. 1, 2006

(30) Foreign Application Priority Data

Nov. 30, 2004 (JP) ................................. 2004-345122

(51) Int. Cl.
*G11B 7/00* (2006.01)

(52) U.S. Cl.
USPC .......................................... 720/658; 720/659

(58) Field of Classification Search
USPC .................................. 720/649, 671, 658–659
See application file for complete search history.

(56) References Cited

U.S. PATENT DOCUMENTS

| | | | | |
|---|---|---|---|---|
| 5,050,154 A | * | 9/1991 | Shimozawa et al. | 369/112.23 |
| 5,596,664 A | * | 1/1997 | Bostica et al. | 385/92 |
| 5,620,928 A | * | 4/1997 | Lee et al. | 438/118 |
| 5,867,469 A | * | 2/1999 | Tanaka et al. | 369/121 |
| 5,923,501 A | * | 7/1999 | Suzuki et al. | 360/264.2 |
| 5,995,321 A | * | 11/1999 | Ishida | 360/97.01 |
| 6,166,872 A | * | 12/2000 | Uno et al. | 360/65 |
| 6,166,888 A | * | 12/2000 | Tsuda et al. | 360/264.2 |
| 6,336,367 B1 | * | 1/2002 | Raisanen | 73/632 |
| 6,534,860 B2 | * | 3/2003 | Turner | 257/718 |
| 6,635,956 B2 | * | 10/2003 | Sakamoto et al. | 257/678 |
| 6,831,882 B1 | * | 12/2004 | Takashima et al. | 369/44.14 |
| 2001/0012255 A1 | * | 8/2001 | Furukawa et al. | 369/75.1 |

(Continued)

FOREIGN PATENT DOCUMENTS

| | | |
|---|---|---|
| JP | 2002-009229 | 1/2002 |
| JP | A-2002-9229 | 1/2002 |

(Continued)

OTHER PUBLICATIONS

Chinese Official Action and Partial Translation Thereof.

(Continued)

*Primary Examiner* — Will J Klimowicz
*Assistant Examiner* — Carlos E Garcia
(74) *Attorney, Agent, or Firm* — Antonelli, Terry, Stout & Kraus, LLP.

(57) ABSTRACT

Provided is a reliable optical pick-up which can prevent deterioration of a performance of a component, shortening of a service life or malfunctioning due to heat generation of an laser driver IC, wherein a metallic pattern is provided on a flexible printed board, having an area wider than the external shape of the laser driver IC and having an exposed outer surface, and made of the same material as that of a wiring pattern. It is preferable to bend the flexible printed board in a mounting part for the laser driver IC so that the metallic pattern is faced to and superposed with a surface of the flexible printed board on the side remote from the surface on which the laser driver IC is mounted.

5 Claims, 10 Drawing Sheets

(56) References Cited

U.S. PATENT DOCUMENTS

| | | |
|---|---|---|
| 2003/0123374 A1* | 7/2003 | Matsumura et al. .......... 369/215 |
| 2003/0202454 A1* | 10/2003 | Negishi et al. ............... 369/121 |
| 2004/0179306 A1* | 9/2004 | Kaneko et al. ............. 360/264.2 |
| 2005/0229196 A1* | 10/2005 | Iizuka et al. .................. 720/658 |
| 2007/0077686 A1* | 4/2007 | Hu ............................... 438/117 |

FOREIGN PATENT DOCUMENTS

| | | |
|---|---|---|
| JP | 2004-128418 | 4/2004 |
| JP | 2004-145921 | 5/2004 |
| JP | A-2004-145921 | 5/2004 |
| WO | WO 01/33562 A1 | 5/2001 |

OTHER PUBLICATIONS

"Perfect Manual of Thermal Design for Electronics", pp. 130-131.
Office Action in JP 2010-6778, mailed May 17, 2011 (in Japanese, 3 pgs), (including translation of Pretrial Re-Examination).
Office Action in JP 2004-345122, mailed Jun. 23, 2009 (2 pgs.), English language translation of Office Action (1 pg).

* cited by examiner

FIG. 2
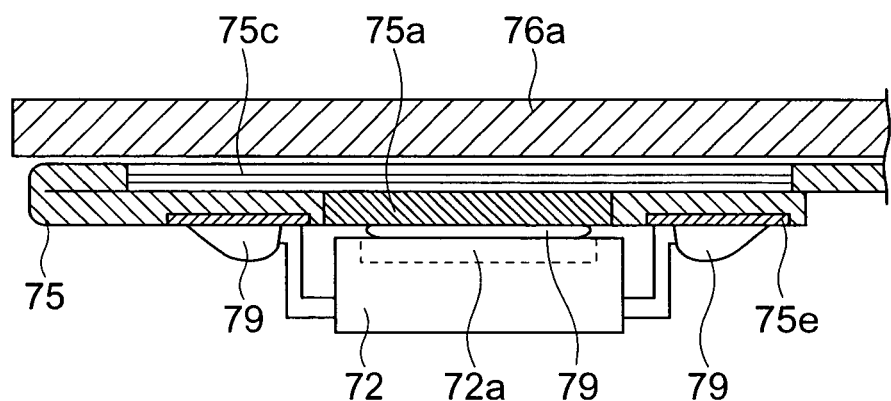
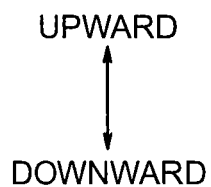

UPWARD
↕
DOWNWARD

FIG. 10
(PRIOR ART)
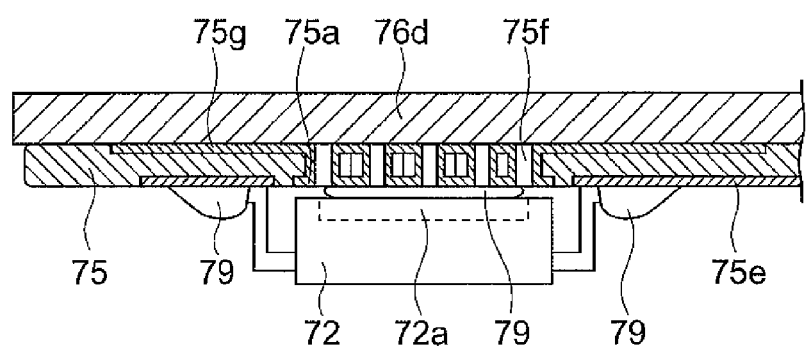
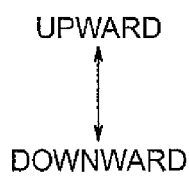

COOLING ARRANGEMENT FOR AN OPTICAL PICK-UP

BACKGROUND OF THE INVENTION

1. Field of the Invention

The present invention relates to an optical pick-up for reproducing data recorded on a recording surface of a disc, or recording data thereon, and a disc unit using thereof.

2. Description of the Related Art

An optical pick-up used in general is mainly composed of three blocks, that is, an objective lens drive device, an optical system and a flexible printed board. The objective lens drive device drives an objective lens in a focusing direction and a tracking direction so as to follow the rotation of an optical disc in order to precisely record or reproduce data. The optical system is composed of an optical component for converging a laser beam by means of the objective lens so as to reproduce data on the disc with the use of a reflected beam, or concentrating the energy of the laser beam onto a recording layer of the disc so as to record date thereon. The flexible printed board connects the lens drive device and the optical system, electrically to an external circuit board.

The above-mentioned optical pick-up is incorporated therein, as main heat generating components, a semiconductor laser for emitting a laser beam, a laser driver IC for controlling the drive of the semiconductor laser, a front monitor for monitoring a laser power upon recording, a photo detector for detecting a reflection beam from a disc and a coil for driving the objective lens in the focusing direction and the tracking direction. Due to heat generation from these components, the temperature of the optical pick-up is raised. In particular, with a writable optical pick-up capable of recording data on a disk such as DVD-RAM/R/RW, CD-R/RW or the like, the heat generation from the semiconductor laser and the laser driver IC is larger. Further, the higher the recording speed, the higher the power of the semiconductor laser is required. Further, in order to ensure the transmission characteristic, it is required to locate the semiconductor laser and the laser driver IC adjacent to each other. In particular, in the case of a DVD recording speed not less than 8×, a circuit, the so-called write strategy, for creating a recording signal waveform has to be incorporated in the laser drive IC in order to transmit a satisfactory high frequency signal to the semiconductor laser. This circuit which has been conventionally incorporated in an IC in a circuit board on the optical disc unit side, causes the heat generation of the laser driver IC to be further increased. Thus, there would be caused deterioration of its performance, lowering of its service life and malfunctioning and the like.

In order to solve the above-mentioned problem of heat generation, there has be presented an optical pick-up in which a heat spreader for the laser driver IC is connected by soldering to a copper foil pattern on a mounting surface of the laser driver IC provided on the flexible printed board and connected to a copper foil on the rear surface through a through hole, and the copper foil on the rear surface thereof is connected to a pick-up cover made of a copper alloy (Refer to an example shown in FIG. 10, which is an application of "Perfect Manual of Thermal Design for Electronics" Nikkan Kogyo Shinbun Co. Jul. 18, 1997 by Naoki Kunimine, Vo., p 130 to 131 and FIG. 11-11). With this configuration, a heat generated from the laser driver IC is dissipated over a sufficiently wide area by the copper foil on the rear surface and the pick-up cover, and accordingly, it is said that the temperature of the laser driver IC can be restrained to a low value.

The above-mentioned conventional technology has caused such a problem that a sufficiently wide area of the copper foil pattern for a wiring patter by which the laser driver IC is mounted, has not been able to be ensured since the copper foil pattern is used for mounting the laser driver IC if the flexible printed board has a single copper foil layer. Further, in the case of using a stainless group metal having a low heat conductivity for the pick-up cover, a heat from the laser driver IC cannot be dissipated in-planewise, and accordingly, sufficient heat radiation cannot be expected.

SUMMARY OF THE INVENTION

An object of the present invention is to provide a reliable optical pick-up which can prevent its components from deteriorating their performances, lowering service lives, malfunctioning and so forth caused by heat generation from a laser driver IC.

The above-mentioned object can be achieved by the provision of a metallic pattern having an area which is wider than an external shape of the laser driver IC having an exposed outer surface and made of a material the same as that of a wiring pattern, on a flexible printed board. Further, the flexible printed board is preferably bent in a part where the laser driver IC is mounted so that the metallic pattern is faced to and superposed with the surface of the flexible printed board thereof on the side remote from the surface on which the laser driver IC is mounted.

Further, the above-mentioned object can also be achieved by the provision of a metallic pattern having an area which is wider than the outer shape of the laser driver IC by extending a ground wiring pattern of the laser driver IC and having an exposed outer surface, on the flexible printed board. Further, the flexible printed board is preferably bent in a part where the laser driver IC is mounted, so that the metal pattern is faced to and superposed on the surface of the flexible printed board on the side remote from the surface thereof on which the laser driver IC is mounted. Further, after the metal pattern is folded, the metal pattern may be cut at its bent part.

Moreover, the above-mentioned object can be achieved by the provision of a metal member having a heat conductivity not less than that of a pick-up housing (it is more preferable if the heat conductivity is larger than that of the pick-up housing), on the flexible printed board in a part where the laser driver IC is mounted, at a surface on the side remote from the surface on which the laser driver IC is mounted.

According to the present invention, there is provided such a configuration that a metal member or a metal pattern made of aluminum, copper or the like is interposed between the flexible printed board and the cover in the part where the laser driver IC is mounted. Thus, a heat which is generated from the laser driver IC and which is then transmitted to the metal member or the metal pattern, is widely dissipated in-planewise of the metal member or the metal pattern. Thereafter, the heat is transmitted to the cover, and is then radiated into the atmosphere around the pick-up. Thus, since the heat from the laser driver IC can be radiated through a wide area, the laser driver IC can be restrained from raising its temperature, thereby it is possible to prevent occurrence of deterioration of its performance, lowering of its service life and malfunctioning. Thus, there can be provided a reliable optical pick-up.

Other objects, features and advantages of the invention will become apparent from the following description of the embodiments of the invention taken in conjunction with the accompanying drawings.

BRIEF DESCRIPTION OF THE DRAWINGS

Explanation will be made of preferred embodiments of the present invention with reference to the accompanying drawings in which:

FIG. 2 is a sectional view partially illustrating a mounting part for a laser driver IC in the embodiment of the present invention;

FIG. 10 is a sectional view partially illustrating a mounting part of a conventional laser driver IC.

DESCRIPTION OF THE PREFERRED EMBODIMENTS

Preferred embodiments of the present invention will be made of the present invention with reference to the accompanying drawings.

Embodiment 1

Figure 9:
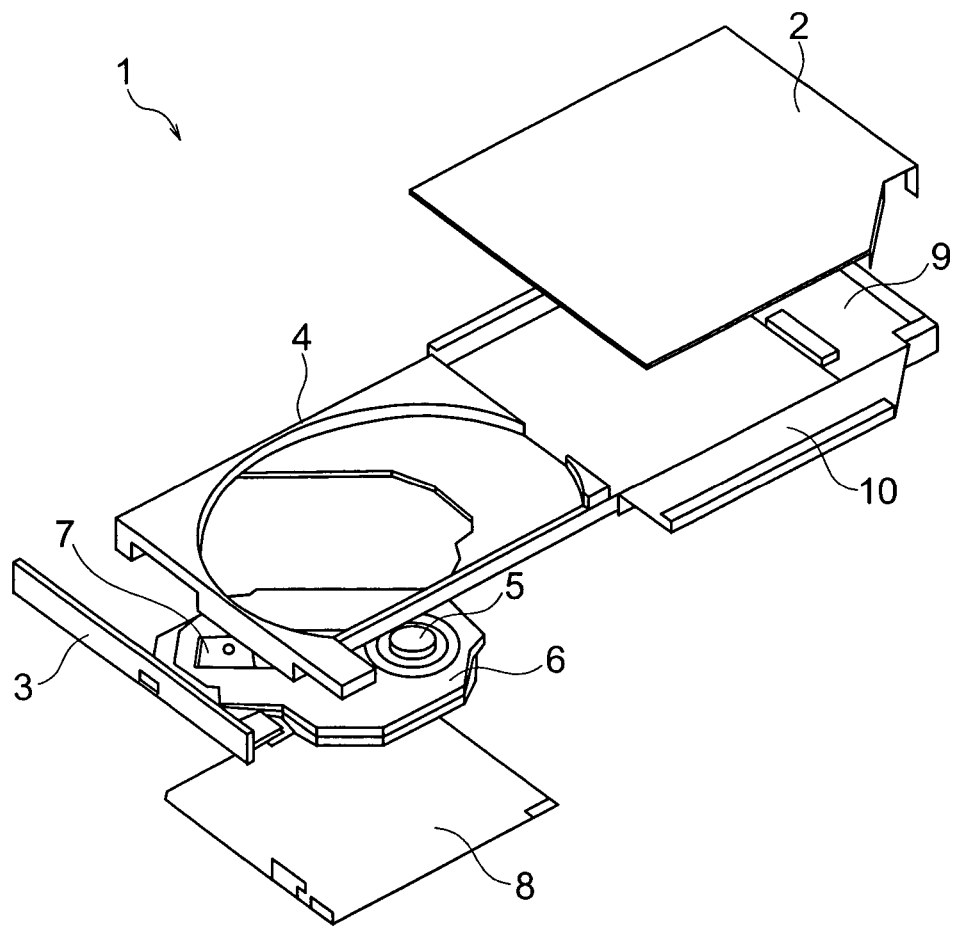
FIG. 9 is an exploded perspective view illustrating an optical disc unit in an embodiment of the present invention.

Referring to FIG. 9 which is an exploded perspective view illustrating a disc unit in which an optical pick-up according to the present invention is applied, the disc unit 10 is mainly composed of a bottom casing 10, a disc tray 4 for loading and unloading a disc serving as a data recording medium into and from the disc unit 10, and a circuit board 9 mounted thereon with semiconductor components for driving and controlling electronic components mounted in the disc unit, and processing signals. The bottom casing 10 is provided thereto with a top casing 2 and a front panel 3 at the upper surface and the front surface thereof, respectively, so as to cover the upper surface and the front surface of the bottom casing 10.

The above-mentioned disc tray 4 is attached thereto with a module type mechanical portion (which will be referred to as "unit mechanism") 6, and is covered over its lower surface with an under cover 8. The unit mechanism 6 is incorporated therein with a spindle motor 5 for rotating the disc, an optical pick-up 7 for recording and reproducing data onto and from the disc, and an optical pick-up feed mechanism for displacing the optical pick up 7, radially of the disc, along a guide shaft (which is not shown).

Figure 8:
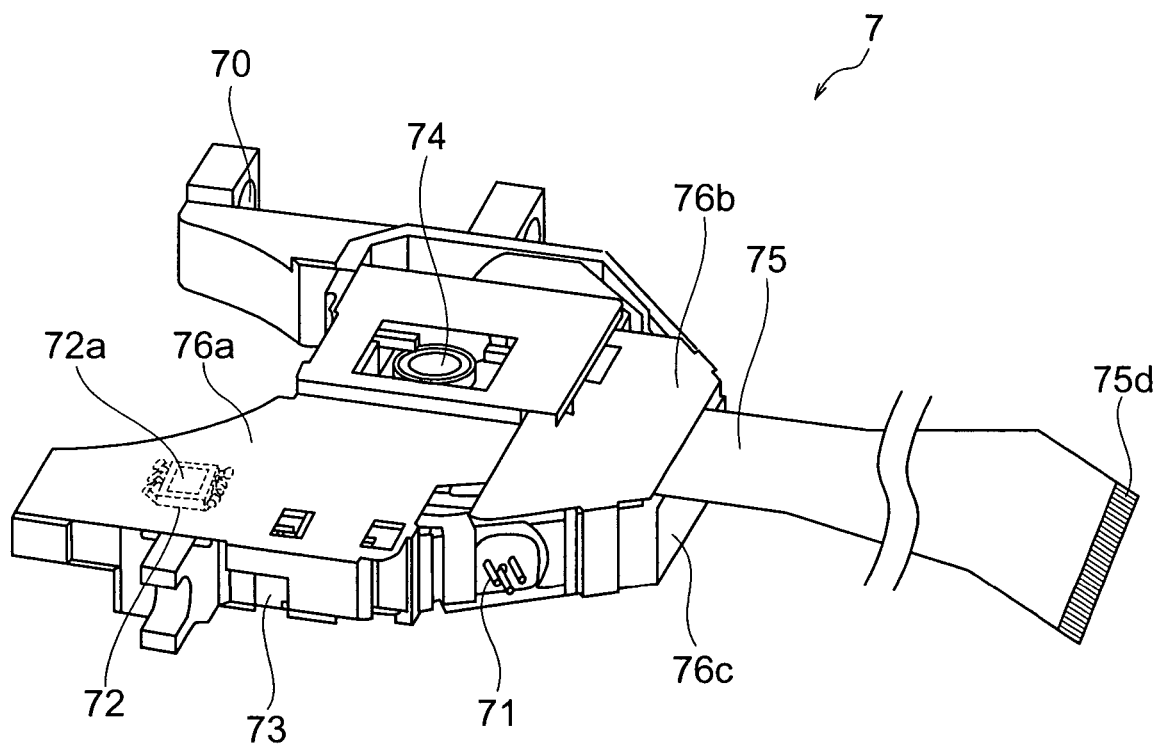
FIG. 8 is a perspective view illustrating an optical pick in an embodiment of the present invention.

Referring to FIG. 8 which is a perspective view illustrating the optical pick-up 7, the optical pick-up 7 is mainly composed of three components, that is, an objective lens drive device 74, an optical system and a flexible printed board 75. The objective lens drive device 74 is a mechanism for driving an objective lens in an focusing direction and a tracking direction in order to precisely record and reproduce data to and from the disc so as to follow the rotation of the disc. The optical system is composed of a semiconductor laser 71 for emitting a laser beam, a laser driver IC 72 for driving the semiconductor laser 71, a lens and a mirror (which are not shown) for diverging a laser beam from the semiconductor laser and focusing the same onto the disc, a photo detector 73 for receiving a reflection beam from the disc and the like. The flexible printed board 75 electrically connects the objective lens drive device 74 and the optical system to the circuit board 9 through the intermediary of a plurality of wiring patterns. This flexible printed board 75 is coated over its surfaces with a polyimide film for ensuring insulation therefor, and is laid along the outer surface of a pick-up housing 70, and is fixed by a cover set thereon.

It is noted that the upward and downward directions of the pick-up are defined by the arrows shown in FIG. 8. That is, the upward direction is toward the side where a first upper cover 76a and a second upper cover 76b are attached to the pick-up housing 70 while the downward direction is toward the side where a lower cover 76c is attached.

Figure 1:
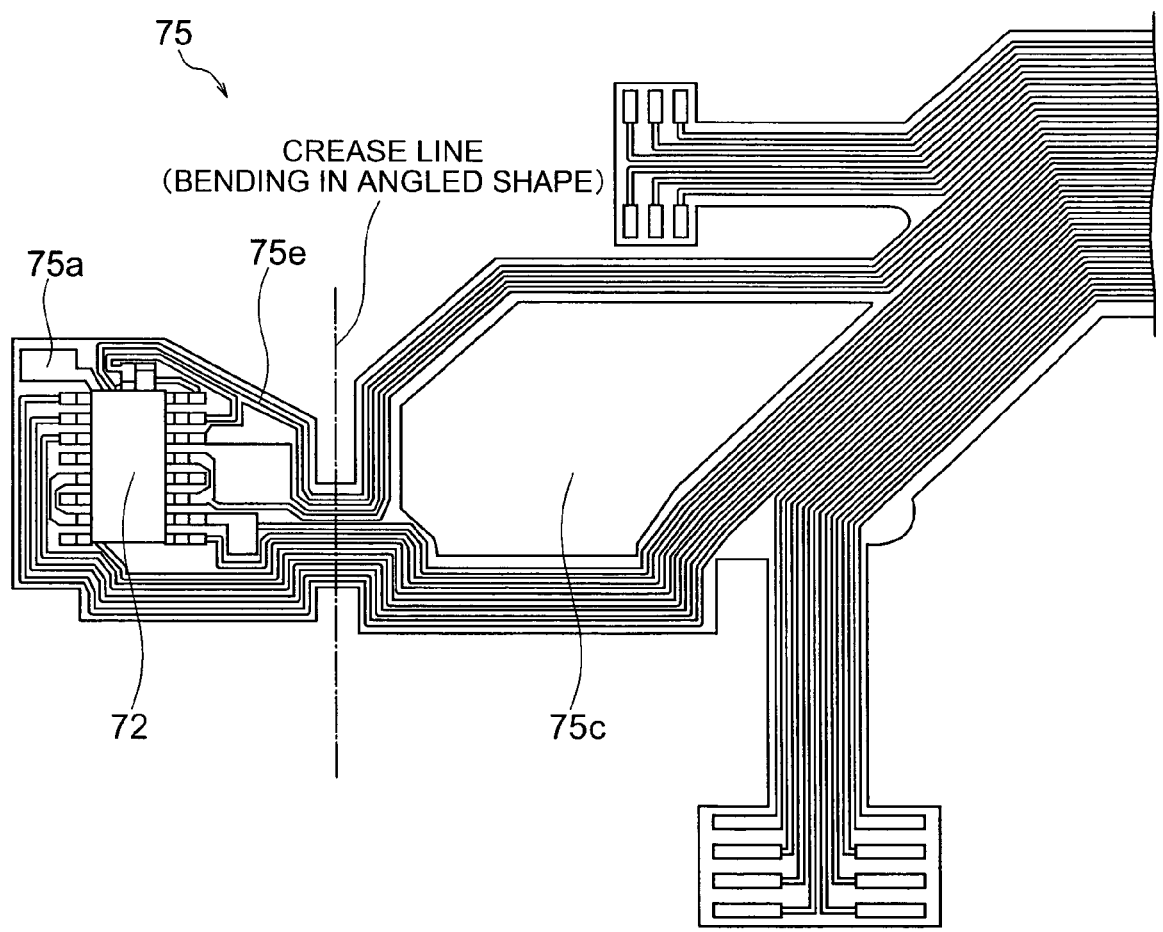
FIG. 1 is a plan view partially illustrating a flexible printed board in an embodiment of the present invention.

Referring to FIG. 1 which is a plan view partially illustrating the flexible printed board 75 in the optical pick-up 7, and FIG. 2 is a sectional view partially illustrating a mounting part of a laser driver IC 72. The laser driver IC 72 is mounted on the flexible printed circuit board 75 on the side which is front of the sheet of FIG. 1, with the use of soldering 79. The laser driver IC 72 is attached thereto with a heat spreader 72a for dissipating heat generated from an internal chip. In this embodiment, the heat spreader 72a is electrically and thermally connected to the ground wiring pattern 75a of the flexible printed board 75 by the soldering 79. With this configuration, the thermal resistance between the heat spreader 72a and the ground wiring pattern 75a of the flexible printed board 75 can be reduced, and in addition, it is possible to aim at enhancing the grounding of the laser driver IC 72, and satisfactorily holding an electric characteristic.

Further, in this embodiment, a metallic pattern 75c is interposed between a connecter terminal part 75d of the flexible printed board 75 and the mounting part of the laser driver IC 72, having an area larger than the external shape of the laser driver IC 72 and having an exposed outer surface. This metallic pattern 75c is made of the same material as that of other wiring patterns 75e, such as copper. Further, a plurality of wiring patterns 75e is present in the mounting part for the laser driver IC 72 on the printed board 75, and accordingly, it is difficult to surely hold the metallic pattern in this part. Thus, in this embodiment, the metallic pattern 75c is located at a position where the external shape of the laser driver IC 72 and that of the metallic pattern 75c are superposed with each other as shown in FIG. 2 when the mounting part for the laser driver IC 72 is folded in an angled shape along a crease line shown in FIG. 1. It is noted here that the wiring patterns 75e are coated over their outer surfaces with a polyimide film, other than the ground wiring pattern 75c, on the surface of the flexible printed board 75 (which is rear of the mounting surface for the laser driver IC 72) which makes contact with the metallic pattern 75c, and accordingly, the metallic pattern 75c and the wiring pattern 75e are prevented from being conducted with each other. Further, since the metallic pattern 75c is bent in a direction opposite to the mounting surface for the laser driver IC 72, the metallic pattern 75c and any of terminals of the laser driver IC 72 are prevented from being conducted from each other. With this configuration, the metallic pattern 75c can ensure a wider area, and accordingly, even though the first upper cover 76a is made of stainless steel or the like having a heat conductivity which is less than that of aluminum and copper, heat generated from the laser drive IC 72 can be dissipated over a wide area through the metallic pattern 75c. Thereareter, the heat generated from the laser driver IC 72 is transmitted through the first upper cover 76a and is radiated from the outer surface of the first upper cover 76a into the atmosphere therearound. Thus, since the wide heat radiation area can be ensured, the temperature of the laser driver IC 72 can be restrained to a low value in comparison with a proof temperature of the laser driver IC 72.

Thus, in this embodiment, there can be exhibited such an advantage that the temperature of the laser driver IC 72 can be restrained from rising without increasing the number of required components. Further, the metallic pattern 75c is not electrically connected to the other wiring patterns. Thus, no fine wiring pattern which can hardly be manufacture is required, and accordingly, the productivity of the flexible printed board 75 can be enhanced, thereby it is possible to reduce the manufacturing costs thereof.

Further, it is desirable to interpose a silicon resin layer 78 between the ground wiring pattern 72a and the metallic pattern 75c and between the metallic pattern 75c and the first upper cover 76a in order to enhance the adherence therebetween. With this configuration, the thermal resistance between the ground wiring pattern 72a and the metallic pattern 75c and the thermal resistance between the metallic pattern 75b and the first upper cover 76a can be decreased to a value which is smaller than that given by an air layer intervening therebetween, thereby it is possible to restrain the temperature of the laser driver IC 72 to a small value in comparison with the proof temperature of the laser driver IC 72.

Figure 3:
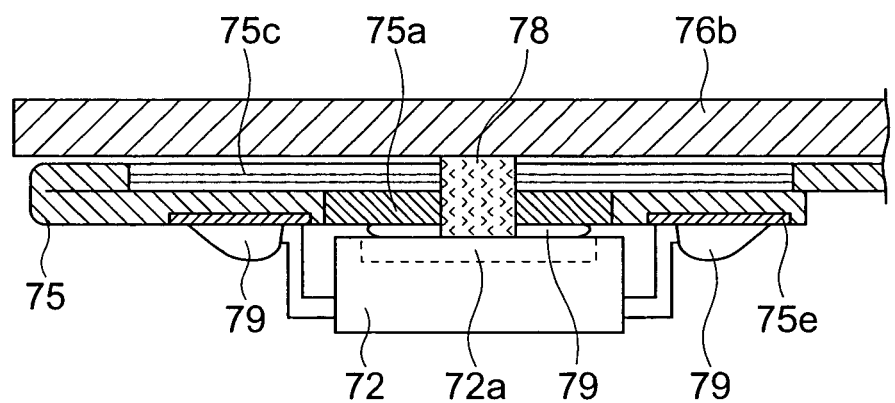
FIG. 3 is a plan view partially illustrating the flexible printed board in an embodiment of the present invention.

Further, it is desirable to make holes through the ground wiring pattern 75a and the metallic pattern 75c as shown in FIG. 3, and then to fill the holes with the silicon resin 78. With this configuration, the silicon resin 78 can be filled after the flexible printed board 75 is bent, thereby it is possible to enhance the working efficiency. Further, the adherence between the members can be enhanced by the silicon resin 8, thereby it is possible to set the thermal resistance between the ground wiring pattern 72a and the metallic pattern 75c and the thermal resistance between the metallic pattern 75b and the first upper cover 76a to be lower than that given by an air layer therebetween. Thus, it is possible to restrain the temperature of the laser driver IC 72 to a small value I comparison with the proof temperature of the laser driver IC 72.

Embodiment 2

Figure 4:
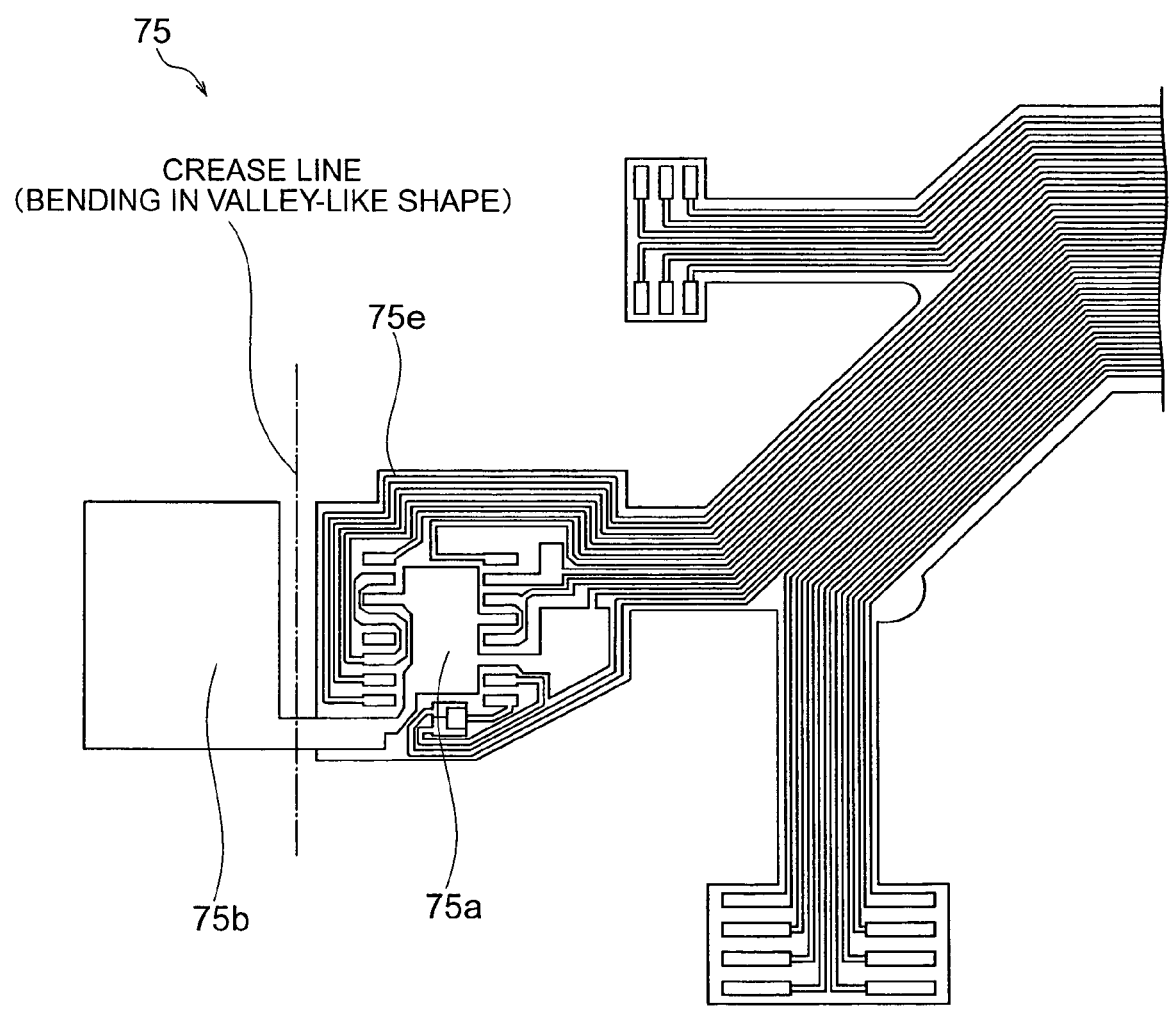
FIG. 4 is a sectional view partially illustrating a part of a mounting part for a laser driver IC in an embodiment of the present invention.
Figure 5:
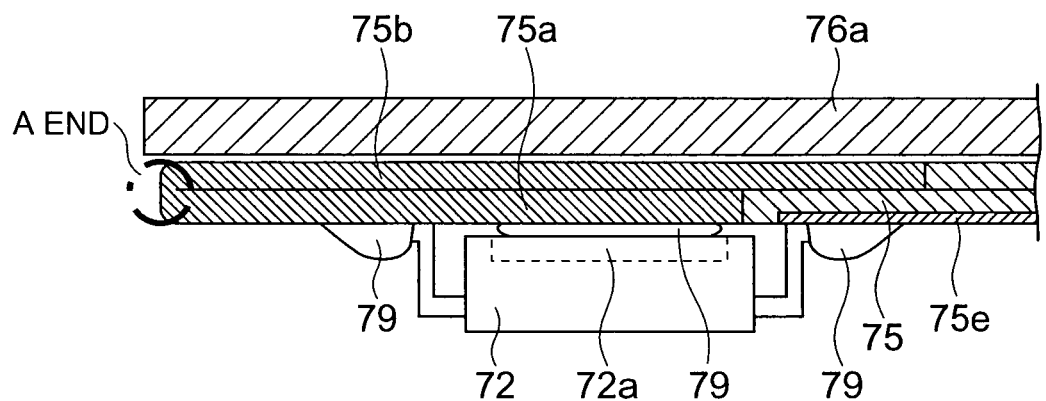
FIG. 5 is a sectional view partially illustrating a mounting part for a laser driver IC in an embodiment of the present invention.

Next, explanation will be made of another embodiment of the present invention with reference to FIGS. 4 and 5 in the case of the application to an optical pick-up 7. FIG. 4 is a plan view partially illustrating a flexible printed board 75 for the optical pick-up 7 in this embodiment of the present invention, and FIG. 5 is a sectional view partially illustrating a mounting part for the laser driver IC 72. The laser driver IC 72 is mounted on the flexible printed board 75 by soldering 79 on the side which is rear of the sheet surface of FIG. 4. The laser driver IC 72 is attached thereto with a heat spreader 72a in order to dissipate a heat generated from an internal chip. In this embodiment, the heat spreader 72a and the ground wiring pattern 75a of the flexible printed board 75 are electrically and thermally connected with each other through the intermediary of soldering 79. With this configuration, the thermal resistance between the laser driver IC 72 and the ground wiring pattern 75a of the flexible printed board 75 can be reduced, and in addition, the grounding of the laser driver IC 72 can be enhanced, thereby it is possible to satisfactorily maintain the electric characteristic.

Further, in this embodiment, of the patterns on the flexible printed board 75, the ground wiring pattern 75a of the laser driver IC 72 is extended in a direction opposite to the terminal part 75d of the flexible printed board 75, and the metallic part 75b is provided at the distal end thereof. Since the metallic pattern 75b is provided outside of the body of the flexible printed board 75, the metallic pattern 75b can have an enlarged area, irrespective of the other wiring patterns 75e. Further, this metallic pattern 75b is made of the same material as that of the other metallic patterns 75e, such as copper. Further, the metallic pattern 75b is bent in a V-like shape along a crease line shown in FIG. 4 so as to superpose the metallic pattern 75b and the ground wiring pattern 75a with one another. In this configuration, the surfaces of the wiring patterns 75e other than the ground wiring pattern 75a are coated thereover with a polyimide film at the surface of the flexible printed board 75 (the surface which is in rear of the mounting surface for the laser driver IC 72) making contact with the metallic pattern 75b, thereby the metallic pattern 75b and the wiring patterns 75e are prevented from being conducted with each other. Further, since the metallic pattern is bent, opposite to the mounting surface for the laser driver IC 72, the metallic pattern 75b and any of terminals of the laser driven IC 72 can be prevented from being conducted with each other. With this configuration, even though the first upper cover 76a is made of stainless steel or the like having a less thermal conductivity in comparison with that of aluminum, copper or the like, a heat generated from the laser driver IC 72 is dissipated over a wide area, in-planewise. Thereafter, the heat is transmitted through the first upper cover 76a and is then radiated from the outer surface of the first upper cover 76a into the atmosphere therearound. Thus, a larger heat radiation area can be ensured, thereby it is possible to restrain the temperature of the laser driver IC 72 to a lower value in comparison with the proof temperature of the laser driver IC 72. Thus, in this embodiment, there can be provided such an advantage that the temperature of the laser driver IC 7 is restrained from rising without increasing the number of required components.

Further, in this embodiment, the metallic pattern 75b is continuous with the ground wiring pattern 75a for the laser driver IC 72. With this configuration, a heat generated from the laser driver IC 72 is transmitted to the heat spreader 72a and the ground wiring pattern 75a of the flexible printed board 75 through the soldering 79, and then is transmitted in an upward direction (the thicknesswise direction of the ground wiring pattern 75a) from a the ground wiring pattern 75a to the metallic pattern 75b, and is also transmitted to the metallic pattern 75b through the inside of the ground wiring pattern 75a (in-planewise of the ground wiring pattern 75a). Thus, the number of heat radiation paths from the ground wiring pattern 75a to the metallic pattern 75b can be increased, thereby it is possible to restrain the temperature of the laser driver IC 72 to a lower value in comparison with the proof-temperature of the laser driver IC 72. Thus, since the number of required components is prevented from being increased, and since the metallic pattern 75 is prevented from being deviated, it is possible to prevent the working efficiency from being lowered.

It is desirable to interpose silicone resin 78 between the ground wiring pattern 75a and the metallic pattern 75b and between the metallic pattern 75b and the first upper cover 76a in order to enhance the adherence between therebetween. With this configuration, the thermal resistance between the ground wiring pattern 72a and the metallic pattern 75b and the thermal resistance between the metallic pattern 75b and the first upper cover 76a can be set to be lower than that given by an air layer therebetween, it is possible to restrain the temperature of the laser driver IC 72 to a low value in comparison with the proof temperature of the laser driver IC 72.

Further, in this embodiment, although the metallic pattern 75b is continuous with the ground wiring pattern 75a of the laser driver IC 72, the bent part (the part A in FIG. 5) of the metallic pattern 75b may be cut after the first upper cover 76a is fixed to the pick-up housing 70.

Embodiment 3

Figure 6:
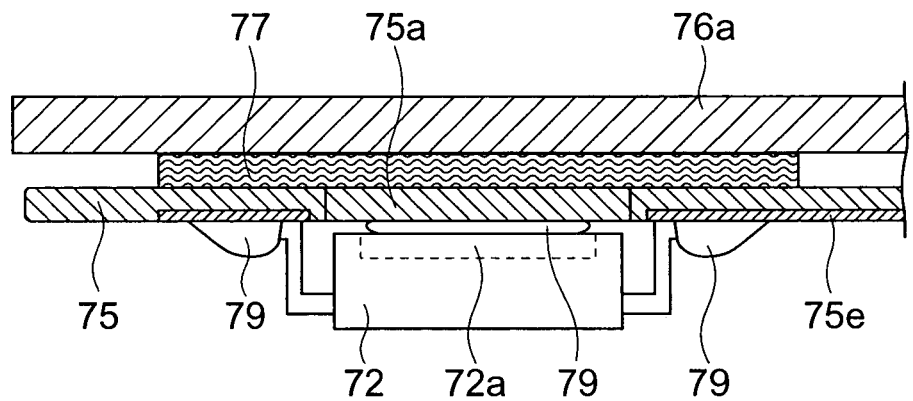
FIG. 6 is a sectional view partially illustrating a mounting part for a laser driver IC in an embodiment of the present invention.
Figure 7:
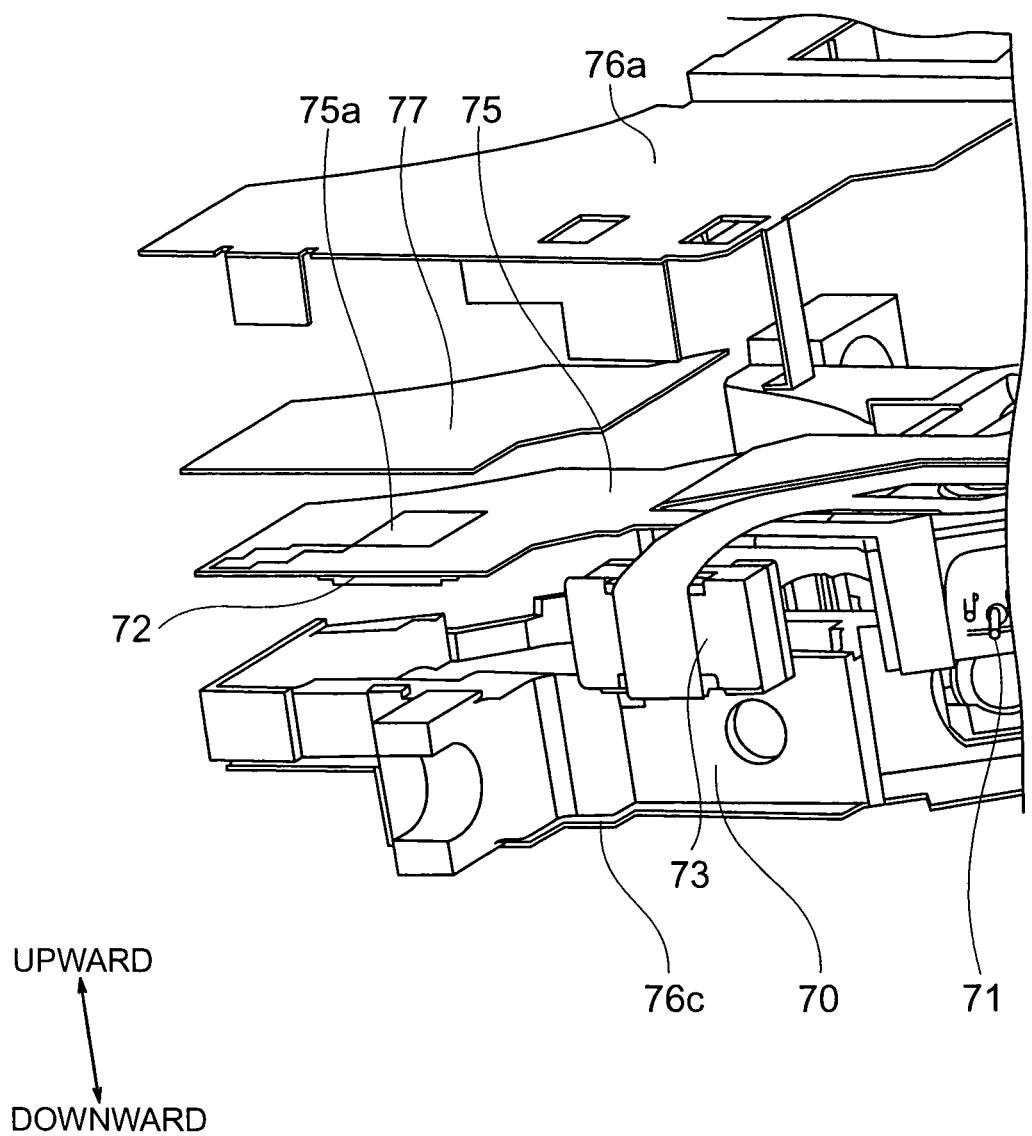
FIG. 7 is an exploded perspective view illustrating a mounting part of a laser driver in an embodiment of the present invention.

Next, explanation will be made of a further another embodiment of the present invention with reference to FIGS. 6 and 7 in which FIG. 6 is a sectional view partially illustrating a mounting part for a laser driver IC in an optical pick-up in this embodiment of the present invention, and FIG. 7 is a perspective view illustrating the mounting part for the laser driver IC.

In this embodiment, a metal member 77 is laid on the flexible printed board 75 on the upper side of the mounting part for the laser driver IC 72, having an area which is larger the external shape of the laser driver IC 72. This metal member 77 is made of a material such as aluminum or copper having a thermal conductivity not les than 100 W/m/K. It is noted here that the outer surfaces of the wiring patterns 75e other than the ground wiring pattern 75a are coated thereover with a polyimide film at the surface of the flexible printed board 77 (a surface which is rear of the mounting surface for the laser driver IC 72) making contact with the metal member 77, and accordingly, it is possible to prevent the metal member 77 and the wiring patterns 75e from being conduced to each other. Further, the metal member 77 is positioned on the side remote from the mounting surface for the laser driver IC as shown in FIG. 6, and accordingly, it is possible to prevent the metal member 77 and terminals of the laser driver IC 72 from being conducted with each other. With this configuration, a heat generated from the laser driver IC 72 is transmitted to the metal member 77 through the ground wiring pattern 75a, and is then dissipated in-planewise of the metal member 77, Thereafter the heat generated from the laser driver IC 72 is transmitted to the first upper cover 76a, and is then radiated from the outer surface of the first upper cover 76a into the atmosphere therearound. Accordingly, even though the first upper cover 76a is made of stainless steel or the like having a thermal conductivity lower than that of aluminum or copper, the heat generated from the laser driver IC 72 can be dissipated in-planewise of the metal member 77 so as to ensure a lager heat radiation area, thereby it is possible to restrain the temperature of the laser driver IC 72 to a low value in comparison with the proof temperature of the laser driver IC 72.

Further, it is desirable to interpose a silicon resin layer between the ground wiring pattern 72a and the metal member 77 and between the metal member 77 and the first upper cover 76a in order to enhance the adherence therebetween. With this configuration, the thermal resistance between the ground wiring pattern 72a and the metal member 77 and the thermal resistance between the metal member 77 and the first upper cover 76a can be restrained to a small value in comparison with that given by an air layer therebetween. Thus, it is possible to restrain the temperature of the laser driver IC in comparison with the proof-temperature of the laser driver IC 72.

Embodiment 4

In a further another embodiment of the present invention, with the use of a metal member 77 having one adhesive surface and having an area which is larger than the external shape of the laser driver IC 72, the metal member 77 may be bonded to the lower surface of the first upper cover 76a. This metal member 77 is made of a material such as aluminum or copper having a heat conductivity of not less than 100 W/m/K. Further, the first upper cover 78a is fixed to the pick-up housing 70 so as to cause the metal member 77 to make close contact with the flexible printed board 75 and the ground wiring pattern 72a thereof. With this configuration, the metal member 77 can be prevented from being positionally deviated during assembly, thereby it is possible to aim at enhancing the assembling ability. Further, even though the first upper cover 76a is made of a material such as stainless steel having a small thermal conductivity in comparison with that of aluminum or copper, a heat generated from the laser driver IC can be dissipated in-planewise of the metal member 77, thereby it is possible to restrain the temperature of the laser driver IC 72 to a lower value in comparison with the proof temperature of the laser driver IC 72.

In this embodiment, although the metal member 77 having an adherence is bonded to the first upper cover 76a, the metal member 77 having an adherence may be bonded to the ground wiring pattern 75a of the flexible printed board 75. In this case, the first upper cover 76a is fixed to the pick-up housing 70 in order to cause the metal member 77 and the lower surface of the first upper cover 76a to make close contact with each other, thereby it is possible to exhibit similar technical effects and advantages.

INDUSTRIAL APPLICABILITY

The present invention can enhance the speed of data recording onto a disc, and to enhance the recording density thereon.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical pick-up comprising a semiconductor laser for emitting a laser beam for reproducing and recording data from and onto a disc, an object lens actuator including an object lens for guiding the laser beam to a predetermined position on the disc, a laser driver IC for driving the semiconductor laser, and a flexible printed board having a wiring pattern for electrically connecting the semiconductor laser and the laser driver IC with an external circuit board, which are mounted in a pick-up casing, wherein a metallic pattern is provided between a connector terminal part and a mounting part of the laser driver IC on the flexible printed board, and wherein an area of an exposed outer surface of said metallic pattern, when viewed in a direction of an optical axis of the object lens of the object lens actuator, is larger than an area of an external shape of the laser driver IC, when viewed in said optical axis direction of the object lens of the object lens actuator, said metallic pattern having an outer surface exposed from the pick-up casing when said flexible printed board is bent so that the exposed outer surface of said metallic pattern and said laser driver IC are superimposed on one another when said flexible printed board is bent, and wherein said metallic pattern is comprised of the same material as that of the wiring pattern, wherein the flexible printed board is bent in the mounting part of the laser driver IC so that the metallic pattern is faced and superimposed with a surface of the flexible printed board on the side remote from the surface on which the laser driver IC is mounted, and wherein the metallic pattern and the wiring pattern, which are comprised of the same material as one another, are overlapped in a height direction of the flexible printed board, before the flexible printed board is bent, when the flexible printed board is viewed in a direction perpendicular to the optical axis of the object lens and parallel to an upper surface of the flexible printed board before the flexible printed board is bent, wherein the mounting part of the laser driver IC is interposed between the laser driver IC and the metallic pattern when the flexible printed board is bent, and wherein the metallic pattern extends from an area where the metallic pattern is superposed with the laser driver IC beyond the area where the metallic pattern and the laser driver IC are superposed in a direction toward said connector terminal part.

2. The optical pick-up as set forth in claim 1, wherein the exposed outer surface of the metallic pattern is disposed with respect to the laser driver IC so as to dissipate heat generated at least by the laser driver IC and enable cooling of the optical pick-up.

3. The optical pick-up according to claim 1, wherein the area of the external shape of the laser driver IC is included within the area of the exposed outer surface of the metallic pattern, when viewed in the optical axis direction of the object lens of the object lens actuator.

4. The optical pick-up according to claim 1, wherein a rear surface of the laser driver IC mounting part of the flexible printed board and the metallic pattern are in thermal contact with each other.

5. The optical pick-up according to claim 4, wherein the area of the external shape of the laser driver IC is included within the area of the exposed outer surface of the metallic pattern, when viewed in the optical axis direction of the object lens of the object lens actuator.

\* \* \* \* \*